(12) United States Patent
Sato et al.

(10) Patent No.: US 9,732,414 B2
(45) Date of Patent: Aug. 15, 2017

(54) CO—CR—PT-BASED SPUTTERING TARGET AND METHOD FOR PRODUCING SAME

(71) Applicant: JX Nippon Mining & Metals Corporation, Tokyo (JP)

(72) Inventors: Atsushi Sato, Ibaraki (JP); Yuki Ikeda, Ibaraki (JP); Atsutoshi Arakawa, Ibaraki (JP); Hideo Takami, Ibaraki (JP); Yuichiro Nakamura, Ibaraki (JP)

(73) Assignee: JX Nippon Mining and Metals Corporation, Tokyo (JP)

( * ) Notice: Subject to any disclaimer, the term of this patent is extended or adjusted under 35 U.S.C. 154(b) by 507 days.

(21) Appl. No.: 14/371,511

(22) PCT Filed: Dec. 12, 2012

(86) PCT No.: PCT/JP2012/082131
§ 371 (c)(1),
(2) Date: Jul. 10, 2014

(87) PCT Pub. No.: WO2013/108520
PCT Pub. Date: Jul. 25, 2013

(65) Prior Publication Data
US 2014/0367254 A1 Dec. 18, 2014

(30) Foreign Application Priority Data
Jan. 18, 2012 (JP) ................................. 2012-007950

(51) Int. Cl.
*C23C 14/34* (2006.01)
*B22F 1/00* (2006.01)
(Continued)

(52) U.S. Cl.
CPC ............ *C23C 14/3414* (2013.01); *B22F 1/00* (2013.01); *B22F 5/00* (2013.01); *B22F 9/04* (2013.01);
(Continued)

(58) Field of Classification Search
CPC ...... B22F 1/00; B22F 5/00; B22F 9/04; B22F 2201/10; B22F 2201/20; B22F 2302/25;
(Continued)

(56) References Cited

U.S. PATENT DOCUMENTS 6,042,777 A 3/2000 Lo et al.
7,927,434 B2 4/2011 Nakamura et al.
(Continued)

FOREIGN PATENT DOCUMENTS

CN 101224496 A 7/2008
JP 2009-132975 A 6/2009
(Continued)

*Primary Examiner* — Rodney McDonald
(74) *Attorney, Agent, or Firm* — Howson & Howson, LLP

(57) ABSTRACT

A sputtering target containing, as metal components, 0.5 to 45 mol % of Cr and remainder being Co, and containing, as non-metal components, two or more types of oxides including Ti oxide, wherein a structure of the sputtering target is configured from regions where oxides including at least Ti oxide are dispersed in Co (non-Cr-based regions), and a region where oxides other than Ti oxide are dispersed in Cr or Co—Cr (Cr-based region), and the non-Cr-based regions are scattered in the Cr-based region. An object of this invention is to provide a sputtering target for forming a granular film which suppresses the formation of coarse complex oxide grains and generates fewer particles during sputtering.

14 Claims, 1 Drawing Sheet

Inside of thick frame: Co-Pt-TiO2-Cr2O3
Outside of thick frame: Co-Cr-Pt-SiO2

(51) Int. Cl.

| | | |
|---|---|---|
| *B22F 9/04* | (2006.01) | |
| *C22C 1/05* | (2006.01) | |
| *C22C 19/07* | (2006.01) | |
| *G11B 5/851* | (2006.01) | |
| *C22C 1/10* | (2006.01) | |
| *C22C 32/00* | (2006.01) | |
| *C23C 14/06* | (2006.01) | |
| *B22F 5/00* | (2006.01) | |
| *H01J 37/34* | (2006.01) | |

(52) U.S. Cl.
CPC .................. *C22C 1/05* (2013.01); *C22C 1/10* (2013.01); *C22C 19/07* (2013.01); *C22C 32/0026* (2013.01); *C23C 14/06* (2013.01); *G11B 5/851* (2013.01); *H01J 37/3429* (2013.01); *B22F 2201/10* (2013.01); *B22F 2201/20* (2013.01); *B22F 2302/25* (2013.01)

(58) Field of Classification Search
CPC .. C22C 1/05; C22C 1/10; C22C 19/07; C22C 32/0026; C23C 14/06; C23C 14/3414; G11B 5/851; H01J 37/3429
USPC ...... 204/298.12, 298.13; 419/30, 32, 38, 44, 419/46, 57, 60
See application file for complete search history.

(56) References Cited

U.S. PATENT DOCUMENTS

| | | | |
|---|---|---|---|
| 8,568,576 B2 | 10/2013 | Sato | |
| 8,679,268 B2 | 3/2014 | Ogino et al. | |
| 2009/0242393 A1 | 10/2009 | Satoh | |
| 2009/0308740 A1 | 12/2009 | Kato et al. | |
| 2010/0270146 A1 | 10/2010 | Nonaka et al. | |
| 2011/0162971 A1 | 7/2011 | Nakamura et al. | |
| 2011/0247930 A1 | 10/2011 | Sato | |
| 2011/0284373 A1 | 11/2011 | Sato et al. | |
| 2012/0118734 A1 | 5/2012 | Sato et al. | |
| 2012/0241317 A1 | 9/2012 | Ikeda et al. | |
| 2012/0273347 A1 | 11/2012 | Koide | |
| 2013/0001079 A1 | 1/2013 | Sato | |
| 2013/0015061 A1 | 1/2013 | Sato | |
| 2013/0112555 A1 | 5/2013 | Ogino et al. | |
| 2013/0134038 A1 | 5/2013 | Sato et al. | |
| 2013/0175167 A1 | 7/2013 | Ikeda et al. | |
| 2013/0206592 A1 | 8/2013 | Arakawa et al. | |
| 2013/0206593 A1 | 8/2013 | Arakawa et al. | |
| 2013/0213802 A1 | 8/2013 | Sato et al. | |
| 2013/0213804 A1 | 8/2013 | Arakawa et al. | |
| 2013/0220804 A1 | 8/2013 | Arakawa et al. | |
| 2013/0248362 A1 | 9/2013 | Ogino et al. | |
| 2013/0341184 A1 | 12/2013 | Morishita et al. | |
| 2014/0001038 A1 | 1/2014 | Ogino et al. | |

FOREIGN PATENT DOCUMENTS

| | | |
|---|---|---|
| JP | 2010-272177 A | 12/2010 |
| JP | 2011-174174 A | 9/2011 |
| JP | 2011-175725 A | 9/2011 |
| JP | 2011-208169 A | 10/2011 |
| JP | 2011-216135 A | 10/2011 |
| WO | 2012/029331 A1 | 3/2012 |

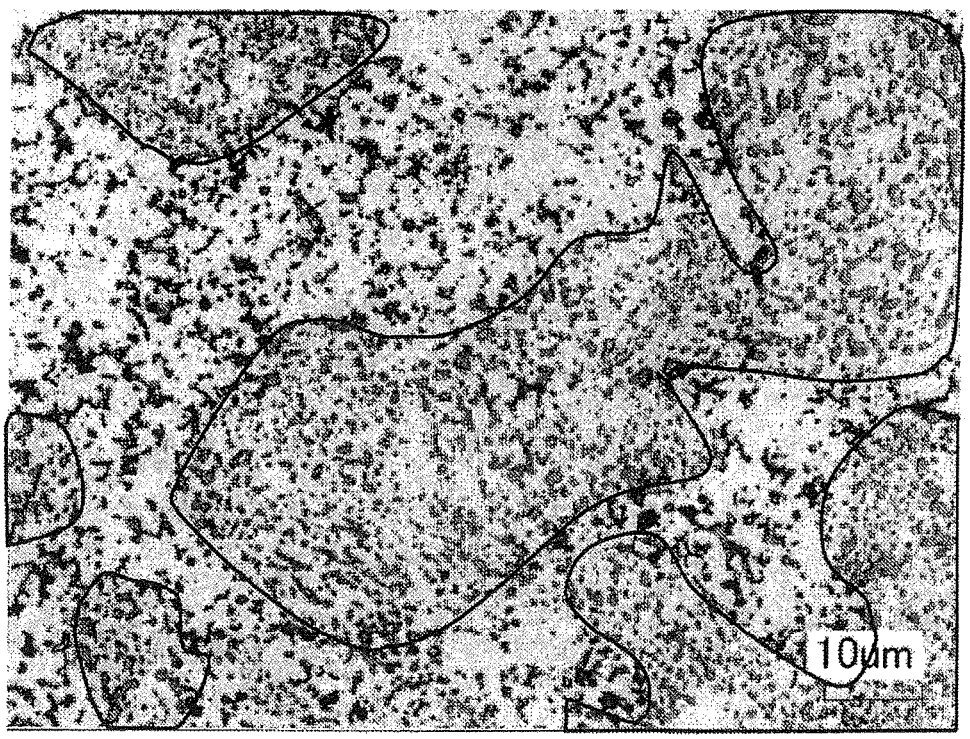
Inside of thick frame: Co-Pt-TiO2-Cr2O3
Outside of thick frame: Co-Cr-Pt-SiO2

CO—CR—PT-BASED SPUTTERING TARGET AND METHOD FOR PRODUCING SAME

BACKGROUND

The present invention relates to a sputtering target for forming a granular film of a magnetic recording medium in a vertical magnetic recording HDD (hard disk drive), and particularly relates to a Co—Cr—Pt-based sputtering target with oxides finely dispersed therein.

In the field of magnetic recording as represented by hard disk drives, materials based on Co, Fe or Ni, which are ferromagnetic metals, are being used as materials of a magnetic thin film in a magnetic recording medium.

As the magnetic thin film of a hard disk drive adopting the vertical magnetic recording method that has been put into practical use in recent years, often used is a composite material configured from a Co—Cr—Pt-based ferromagnetic alloy having Co as its main component and nonmagnetic inorganic particles. In addition, the foregoing magnetic thin film is often produced by sputtering a sintered compact sputtering target made from foregoing materials via a DC magnetron sputtering device in light of its high productivity.

Meanwhile, when sputtering is performed using a sputtering device, there is a problem in that particles are generated. It is known that most of the particles that are generated during the deposition of a granular film are caused by the oxides in the target structure. In recent years, since the floating height of a magnetic head is decreasing in a hard disk drive pursuant to the increase in recording density, the size and number of particles that are tolerable in a magnetic recording medium are becoming even more strictly regulated.

Various techniques are known in relation to a sputtering target for forming a granular film and its production method (for instance, Patent Documents 1 to 4). For example, Patent Document discloses a method for suppressing the aggregation of oxide particles, refining the target structure, and reducing the generation of particles by mixing a primary sintered compact powder, which is obtained by mixing, sintering and pulverizing a part of the raw material powder in advance, upon mixing and pulverizing the raw material powder using a ball mill or the like.

PRIOR ART DOCUMENTS

Patent Documents

Patent Document 1: Japanese Patent Application Publication No. 2011-208169
Patent Document 2: Japanese Patent Application Publication No. 2011-174174
Patent Document 3: Japanese Patent Application Publication No. 2011-175725
Patent Document 4: Japanese Patent Application No. 2011-53631

SUMMARY

Generally speaking, upon producing a sputtering target for forming a granular film, there are cases where nonmagnetic oxides become aggregated, and particles are generated during sputtering with such aggregated oxides as the source. The conventional technologies described above disperse the oxides in the sputtering target in a parent phase alloy to suppress the generation of particles.

Nevertheless, in cases where Ti (titanium) oxide is used as the nonmagnetic oxide, in certain cases the Ti oxide and metal Cr (chromium) would react during sintering and form coarse complex oxide grains, and, in addition to the aggregation of oxides, these coarse complex oxide grains would also become the cause of the generation of particles.

In light of the foregoing problems, an object of this invention is to provide a sputtering target for forming a granular film which suppresses the formation of the foregoing coarse complex oxide grains and generates fewer particles during sputtering.

In order to achieve the foregoing object, as a result of intense study, the present inventors discovered that the formation of the coarse complex oxide grains can be suppressed by restricting the contact of metal Cr and Ti oxide. The present inventors further discovered that the thus produced sputtering target can reduce the generation of particles since oxides are finely dispersed in the parent phase alloy, and improve the yield during deposition.

Based on the foregoing discovery, the present invention provides the following: 1) A sputtering target containing, as metal components, 0.5 to 45 mol % of Cr and remainder being Co, and containing, as non-metal components, two or more types of oxides including Ti oxide, wherein a structure of the sputtering target is configured from regions where oxides including at least Ti oxide are dispersed in Co (non-Cr-based regions: note that the term "non-Cr-based regions" refers to "regions that do not include metal Cr"; hereinafter the same), and a region where oxides other than Ti oxide are dispersed in Cr or Co—Cr (Cr-based region), and the non-Cr-based regions are scattered in the Cr-based region. 2) A sputtering target containing, as metal components, 0.5 to 30 mol % of Cr, 0.5 to 30 mol % of Pt, and remainder being Co, and containing, as non-metal components, two or more types of oxides including Ti oxide, wherein a structure of the sputtering target is configured from regions where oxides including at least Ti oxide are dispersed in Co or Co-Pt (non-Cr-based regions), and a region where oxides other than Ti oxide are dispersed in one or more types of phases of Co—Cr, Cr—Pt, and Co—Cr—Pt (Cr-based region), and the non-Cr-based regions are scattered in the Cr-based region. 3) The sputtering target according to 1) or 2) above, wherein the two or more types of oxides (excluding Ti oxide) are oxides of one or more types of elements selected from B, Mg, Al, Si, Cr, Zr, Nb, and Ta. 4) The sputtering target according to any one of 1) to 3) above, wherein a content of the oxides in the sputtering target is, based on a volume ratio, 20% or more and less than 50%. 5) The sputtering target according to any one of 1) to 4) above, wherein the sputtering target additionally contains, as metal components, one or more types of elements selected from B, Cu, Mo, Ru, Ta, and W.

6) A method of producing a sputtering target comprising a step of mixing a metal powder and an oxide powder including Ti oxide and pressing and sintering a resulting mixed powder A in a vacuum or an inert gas atmosphere to produce a sintered compact A, and pulverizing and sieving the sintered compact A to produce a sintered compact powder A corresponding to non-Cr-based regions, a step of mixing a metal powder and oxide powders other than Ti oxide to produce a mixed powder B corresponding to a Cr-based region, and a step of mixing the sintered compact powder A and the mixed powder B, and thereafter pressing and sintering a resulting mixed powder in a vacuum or an inert gas atmosphere to produce a secondary sintered compact to be used as a target material. 7) The method of producing a sputtering target according to 6) above, wherein a grain size of the sintered compact powder A is 20 to 200 µm.

According to the Co—Cr—Pt-based sputtering target of the present invention, the formation of the coarse complex oxide grains can be inhibited by restricting the reaction of Ti oxide and metal Cr, and the dispersibility of oxides can be improved. Thus, the present invention yields superior effects of being able to reduce the amount of particles that are generated during sputtering, and improve the yield during deposition.

BRIEF DESCRIPTION OF THE DRAWING

FIG. 1 is an image of the target structure upon observing the target of Example 3 using an optical microscope.

DETAILED DESCRIPTION

The sputtering target of the present invention is characterized in containing, as metal components, 0.5 to 45 mol % of Cr and remainder being Co, and containing, as non-metal components, two or more types of oxides including Ti oxide, wherein a structure of the sputtering target is configured from regions where oxides including at least Ti oxide are dispersed in Co (non-Cr-based regions), and a region where oxides other than Ti oxide are dispersed in Cr or Co—Cr (Cr-based region), and the non-Cr-based regions are scattered in the Cr-based region.

The sputtering target of the present invention can restrict the formation of coarse complex oxides since Ti oxide and metal Cr (or Cr alloy) will not react during sintering, and thereby suppress the generation of particles caused by the reaction of Ti oxide and metal Cr (or Cr alloy).

Moreover, since the area of these individual oxide particles will affect the generation of particles, the mean area of the individual oxide particles is desirably less than 2.0 µm$^2$.

Moreover, the sputtering target of the present invention contains, as metal components, 0.5 to 30 mol % of Cr, 0.5 to 30 mol % of Pt, and remainder being Co, and contains, as non-metal components, two or more types of oxides including Ti oxide, wherein a structure of the sputtering target is configured from regions where oxides including at least Ti oxide are dispersed in Co or Co—Pt (non-Cr-based regions), and a region where oxides other than Ti oxide are dispersed in one or more types of phases of Co—Cr, Cr—Pt, and Co—Cr—Pt (Cr-based region), and the non-Cr-based regions are scattered in the Cr-based region.

The Cr-based region includes the three types of Co—Cr, Cr—Pt, and Co—Cr—Pt as described above, but includes a state (structure) in which oxides other than Ti oxide are dispersed in one or more such types. The sputtering target of the present invention can restrict the formation of coarse complex oxides since Ti oxide and Cr alloy will not react during sintering, and thereby suppress the generation of particles caused by the reaction of Ti oxide and Cr alloy.

Similar to the above, since the area of these individual oxide particles will affect the generation of particles, the mean area of the individual oxide particles is desirably less than 2.0 µm$^2$.

Moreover, with the sputtering target of the present invention, the two or more types of oxides (excluding Ti oxide) are oxides of one or more types of elements selected from B, Mg, Al, Si, Cr, Zr, Nb, and Ta. Since these nonmagnetic oxides do not react as easily with metal Cr or Cr alloy in comparison to Ti oxide, these oxides may be dispersed in metal Cr or Cr alloy.

Moreover, with the sputtering target of the present invention, the content of nonmagnetic component oxides in the sputtering target is, based on a volume ratio, 20% or more and less than 50%. Favorable magnetic properties can be obtained when the volume ratio of the nonmagnetic oxides is 20% or more and less than 50%.

Moreover, the sputtering target of the present invention additionally contains, as metal components, one or more types of elements selected from B, Cu, Mo, Ru, Ta, and W. These metal components may be suitably added in accordance with the intended magnetic properties.

Note that, when B is added as a metal component, depending on the target composition, there are cases where B is reduced to another oxide during sintering and forms $B_2O_3$, but this is a level that can be quantitatively ignored. Accordingly, it could be said that the B existing in the target derives from the B that was added as a metal component, and the $B_2O_3$ existing in the target derives from the $B_2O_3$ that was added as an oxide.

The sputtering target of the present invention can be produced, for example, based on the following method.

For example, a Co powder, a Cr powder and a Pt powder are prepared as the metal powders, a $TiO_2$ powder and a $SiO_2$ powder are prepared as the oxide powders, and, among the foregoing raw material powders, metal powders (Co powder, Pt powder) other than the Cr powder and oxide powders including at least the $TiO_2$ powder are mixed to obtain a mixed powder (mixed powder A). As described above, with the present invention, it is important that the Ti oxide, which easily reacts with metal Cr or Cr alloy, and metals other than Cr are mixed and caused to react in advance. Here, the mixed powder A refers to a mixed powder obtained by mixing powders (Co, Pt) other than Cr as the metal components, and oxide powders including at least Ti oxide as the non-metal components.

Subsequently, the obtained mixed powder (mixed powder A) is pressed and sintered in a vacuum or an inert gas atmosphere to produce a sintered compact (sintered compact A), and the sintered compact is pulverized and sieved to produce a sintered compact powder (sintered compact powder A) corresponding to the non-Cr-based regions. Here, the sintered compact powder A refers to a powder obtained by mixing and sintering powders (Co, Pt) other than Cr as the metal components, and oxide powders including at least Ti oxide as the non-metal components, and thereafter pulverizing and sieving the obtained sintered compact.

Here, the grain size of the sintered compact powder A is preferably 20 to 200 µm. When the grain size is less than 20 µm, the contact area of the non-Cr regions and the Cr region will increase, and it becomes difficult to suppress the reaction of metal Cr or Cr alloy and Ti oxide during sintering. Meanwhile, when the grain size exceeds 200 µm, it may not be possible to obtain a sputtered film having a uniform composition upon sputtering.

Subsequently, the Cr powder and the oxide powder ($SiO_2$ powder) other than the $TiO_2$ powder are mixed to obtain a mixed powder (mixed powder B) corresponding to the Cr-based region. Here, the mixed powder B refers to a mixed powder obtained by mixing powders including at least Cr as the metal components, and oxide powders other than Ti oxide as the non-metal components.

Subsequently, the sintered compact powder A and the mixed powder B are mixed, and the obtained mixed powder is thereafter pressed and sintered in a vacuum or an inert gas atmosphere to produce a secondary sintered compact to be used as the target material. The thus obtained secondary sintered compact is processed into an intended shape to produce the sputtering target of the present invention.

It is thereby possible to produce a Co—Cr—Pt-based sputtering target in which oxides are uniformly and finely dispersed therein and which is free from the formation of coarse complex oxide grains caused by the reaction of Ti oxide and metal Cr or Cr alloy. The thus produced sputtering target of the present invention is useful as a sputtering target for use in depositing a magnetic thin film having a granular structure.

EXAMPLES

The present invention is now explained based on the following Examples and Comparative Examples. Note that these Examples are merely illustrative, and the present invention is not limited in any way by these Examples. In other words, the present invention is limited only based on its scope of claims, and the present invention covers various modifications other than the Examples included herein.

Example 1

A Co powder having an average grain size of 3 μm and a Cr powder having an average grain size of 5 μm were prepared as metal raw material powders, and a $TiO_2$ powder having an average grain size of 1 μm and a $SiO_2$ powder having an average grain size of 1 μm were prepared as oxide raw material powders. In addition, the respective powders were each weighed to be 1600 g based on the following composition ratio to prepare a mixed powder A and a mixed powder B.

(Mixed powder A): 90.5Co-9.5$TiO_2$ (mol %)
(Mixed powder B): 72.36Co-20.73Cr-6.91$SiO_2$ (mol %)

The weighed powders were respectively placed in a ball mill pot having a capacity of 10 liters together with zirconia balls as the grinding medium, and mixed by being rotated for 20 hours. Thereafter, only the mixed powder A was filled in a carbon mold, and hot pressed in a vacuum atmosphere under the following conditions; namely, temperature of 1000° C., holding time of 2 hours, and pressure of 30 MPa, to obtain a sintered compact (sintered compact A). Subsequently, the obtained sintered compact was pulverized using a jaw crusher and a stone mill-type grinder, and thereafter sieved using sieves having a sieve opening of 50 μm and 150 μm to obtain a sintered compact powder A having a grain size of 50 to 150 μm.

Subsequently, the sintered compact powder A and the mixed powder B were respectively weighed; specifically, the sintered compact powder A was weighed to be 726.7 g and the mixed powder B was weighed to be 944.1 g, so that the composition of the overall sputtering target resulted in the following composition ratio.

(Target composition): 80Co-12Cr-4$TiO_2$-4$SiO_2$ (mol %)

The weighed powders were placed in a planetary-screw mixer having a ball capacity of approximately 7 liters, and mixed for 20 minutes to obtain a mixed powder for preparing a secondary sintered compact. The thus obtained mixed powder for preparing a secondary sintered compact was filled in a carbon mold, and hot pressed in a vacuum atmosphere under the following conditions; namely, temperature of 1050° C., holding time of 2 hours, and pressure of 30 MPa, whereby a sintered compact having a relative density of 98.2% was obtained. In addition, the obtained sintered compact was machined with a lathe to obtain a disk-shaped sputtering target having a diameter of 180 mm, and a thickness of 5 mm.

Upon observing the microstructure of the sputtering target of Example 1, it was confirmed that the structure included regions (non-Cr-based regions) in which $TiO_2$ is dispersed in Co, and a region (Cr-based region) in which $SiO_2$ is dispersed in a Co—Cr alloy, and the non-Cr-based regions are scattered in the Cr-based region. In addition, the structure of the polished surface of the target was photographed in a visual field size of 100 μm×75 μm at 8 arbitrarily selected locations on the target structure surface, and the captured structure photograph was binarized using image processing software to obtain a mean area per oxide particle, whereby the result was 1.1 μm².

Subsequently, this target was mounted on a DC magnetron sputtering device and sputtered. The sputtering conditions were a sputtering power of 1 kw and an Ar gas pressure of 1.5 Pa, and, after performing pre-sputtering at 2 kWhr, a film was sputtered on a silicon substrate having a 4-inch diameter with a target film thickness of 1000 nm. In addition, the number of particles that adhered onto the substrate was measured using a particle counter. Consequently, the number of particles on the silicon substrate was 5 particles.

Comparative Example 1

A Co powder having an average grain size of 3 μm and a Cr powder having an average grain size of 5 μm were prepared as metal raw material powders, and a $TiO_2$ powder having an average grain size of 1 μm and a $SiO_2$ powder having an average grain size of 1 μm were prepared as oxide raw material powders. Subsequently, these powders were weighed to be 1670.7 g in total so that the composition of the overall sputtering target resulted in the following composition ratio.

(Target composition): 80Co-12Cr-4$TiO_2$-4$SiO_2$ (mol %)

The weighed powders were placed in a ball mill pot having a capacity of 10 liters together with zirconia balls as the grinding medium, and mixed by being rotated for 20 hours. The thus obtained mixed powder was filled in a carbon mold, and hot pressed in a vacuum atmosphere under the following conditions; namely, temperature of 1050° C., holding time of 2 hours, and pressure of 30 MPa, whereby a sintered compact having a relative density of 98.2% was obtained. In addition, the obtained sintered compact was machined with a lathe to obtain a disk-shaped sputtering target having a diameter of 180 mm, and a thickness of 5 mm.

Upon observing the microstructure of the sputtering target of Comparative Example 1, it was confirmed that $TiO_2$ and $SiO_2$ were dispersed in a Co—Cr alloy. In addition, the structure of the polished surface of the target was photographed in a visual field size of 100 μm×75 μm at 8 arbitrarily selected locations on the target structure surface, and the captured structure photograph was binarized using image processing software to obtain a mean area per oxide particle, whereby the result was 2.1 μm², and the oxides had coarsened in comparison to Example 1.

Subsequently, this target was mounted on a DC magnetron sputtering device and sputtered. The sputtering conditions were a sputtering power of 1 kw and an Ar gas pressure of 1.5 Pa, and, after performing pre-sputtering at 2 kWhr, a film was sputtered on a silicon substrate having a 4-inch diameter with a target film thickness of 1000 nm. In addition, the number of particles that adhered onto the substrate was measured using a particle counter. Consequently, the number of particles on the silicon substrate was 13 particles, and the number of particles had increased in comparison to Example 1.

Example 2

A Co powder having an average grain size of 3 μm, a Cr powder having an average grain size of 5 μm and a Pt powder having an average grain size of 2 μm were prepared as metal raw material powders, and a $TiO_2$ powder having an average grain size of 1 μm, a $SiO_2$ powder having an average grain size of 1 μm and a $Cr_2O_3$ powder having an average grain size of 3 μm were prepared as oxide raw material powders. In addition, the respective powders were each weighed to be 2000 g based on the following composition ratio to prepare a mixed powder A and a mixed powder B.

(Mixed powder A): 68.15Co-22.29Pt-4.78$TiO_2$-4.78$Cr_2O_3$ (mol %)

(Mixed powder B): 59.68Co-32.26Cr-8.06$SiO_2$ (mol %)

The weighed powders were respectively placed in a ball mill pot having a capacity of 10 liters together with zirconia balls as the grinding medium, and mixed by being rotated for 20 hours. Thereafter, only the mixed powder A was filled in a carbon mold, and hot pressed in a vacuum atmosphere under the following conditions; namely, temperature of 1000° C., holding time of 2 hours, and pressure of 30 MPa, to obtain a sintered compact (sintered compact A). Subsequently, the obtained sintered compact was pulverized using a jaw crusher and a stone mill-type grinder, and thereafter sieved using sieves having a sieve opening of 38 μm and 106 μm to obtain a sintered compact powder A having a grain size of 38 to 106 μm.

Subsequently, the sintered compact powder A and the mixed powder B were respectively weighed; specifically, the sintered compact powder A was weighed to be 1550.6 g and the mixed powder B was weighed to be 550.6 g, so that the composition of the overall sputtering target resulted in the following composition ratio.

(Target composition): 65Co-12Cr-14Pt-3$TiO_2$-3$SiO_2$-3$Cr_2O_3$ (mol %)

The weighed powders were placed in a planetary-screw mixer having a ball capacity of approximately 7 liters, and mixed for 20 minutes to obtain a mixed powder for preparing a secondary sintered compact. The thus obtained mixed powder for preparing a secondary sintered compact was filled in a carbon mold, and hot pressed in a vacuum atmosphere under the following conditions; namely, temperature of 1100° C., holding time of 2 hours, and pressure of 30 MPa, whereby a sintered compact having a relative density of 97.9% was obtained. In addition, the obtained sintered compact was machined with a lathe to obtain a disk-shaped sputtering target having a diameter of 180 mm, and a thickness of 5 mm.

Upon observing the microstructure of the sputtering target of Example 2, it was confirmed that the structure included regions (non-Cr-based regions) in which $TiO_2$ and $Cr_2O_3$ are dispersed in Co—Pt, and a region (Cr-based region) in which $SiO_2$ is dispersed in a Co—Cr alloy, and the non-Cr-based regions are scattered in the Cr-based region. In addition, the structure of the polished surface of the target was photographed in a visual field size of 100 μm×75 μm at 8 arbitrarily selected locations on the target structure surface, and the captured structure photograph was binarized using image processing software to obtain a mean area per oxide particle, whereby the result was 1.4 μm$^2$.

Subsequently, this target was mounted on a DC magnetron sputtering device and sputtered. The sputtering conditions were a sputtering power of 1 kw and an Ar gas pressure of 1.5 Pa, and, after performing pre-sputtering at 2 kWhr, a film was sputtered on a silicon substrate having a 4-inch diameter with a target film thickness of 1000 nm. In addition, the number of particles that adhered onto the substrate was measured using a particle counter. Consequently, the number of particles on the silicon substrate was 3 particles.

Example 3

A Co powder having an average grain size of 3 μm, a Cr powder having an average grain size of 5 μm and a Pt powder having an average grain size of 2 μm were prepared as metal raw material powders, and a $TiO_2$ powder having an average grain size of 1 μm, a $SiO_2$ powder having an average grain size of 1 μm and a $Cr_2O_3$ powder having an average grain size of 3 μm were prepared as oxide raw material powders. In addition, the respective powders were each weighed to be 2000 g based on the following composition ratio to prepare a mixed powder A and a mixed powder B.

(Mixed powder A): 81.76Co-9.12Pt-4.56$TiO_2$-4.56$Cr_2O_3$ (mol %)

(Mixed powder B): 32.75Co-35.09Cr-23.39Pt-8.77$SiO_2$ (mol %)

The weighed powders were respectively placed in a ball mill pot having a capacity of 10 liters together with zirconia balls as the grinding medium, and mixed by being rotated for 20 hours. Thereafter, only the mixed powder A was filled in a carbon mold, and hot pressed in a vacuum atmosphere under the following conditions; namely, temperature of 1000° C., holding time of 2 hours, and pressure of 30 MPa, to obtain a sintered compact (sintered compact A). Subsequently, the obtained sintered compact was pulverized using a jaw crusher and a stone mill-type grinder, and thereafter sieved using sieves having a sieve opening of 38 μm and 106 μm to obtain a sintered compact powder A having a grain size of 38 to 106 μm.

Subsequently, the sintered compact powder A and the mixed powder B were respectively weighed; specifically, the sintered compact powder A was weighed to be 1312.0 g and the mixed powder B was weighed to be 788.0 g, so that the composition of the overall sputtering target resulted in the following composition ratio.

(Target composition): 65Co-12Cr-14Pt-3$TiO_2$-3$SiO_2$-3$Cr_2O_3$ (mol %)

The weighed powders were placed in a planetary-screw mixer having a ball capacity of approximately 7 liters, and mixed for 20 minutes to obtain a mixed powder for preparing a secondary sintered compact. The thus obtained mixed powder for preparing a secondary sintered compact was filled in a carbon mold, and hot pressed in a vacuum atmosphere under the following conditions; namely, temperature of 1100° C., holding time of 2 hours, and pressure of 30 MPa, whereby a sintered compact having a relative density of 97.6% was obtained. In addition, the obtained sintered compact was machined with a lathe to obtain a disk-shaped sputtering target having a diameter of 180 mm, and a thickness of 5 mm.

Upon observing the microstructure of the sputtering target of Example 3, it was confirmed that the structure included regions (non-Cr-based regions) in which $TiO_2$ and $Cr_2O_3$ are dispersed in Co—Pt, and a region (Cr-based region) in which $SiO_2$ is dispersed in a Co—Cr—Pt alloy, and the non-Cr-based regions are scattered in the Cr-based region. The photograph of the structure of the target of Example 3 is shown in FIG. 1. In FIG. 1, the area inside the thick frame is Co—Pt—TiO$_2$—Cr$_2$O$_3$ (non-Cr-based regions), and the area outside the thick frame is Co—Cr—Pt—SiO$_2$ (Cr-based region).

In addition, the structure of the polished surface of the target was photographed in a visual field size of 100 μm×75 μm at 8 arbitrarily selected locations on the target structure surface, and the captured structure photograph was binarized using image processing software to obtain a mean area per oxide particle, whereby the result was 1.5 μm$^2$.

Subsequently, this target was mounted on a DC magnetron sputtering device and sputtered. The sputtering conditions were a sputtering power of 1 kw and an Ar gas pressure of 1.5 Pa, and, after performing pre-sputtering at 2 kWhr, a film was sputtered on a silicon substrate having a 4-inch diameter with a target film thickness of 1000 nm. In addition, the number of particles that adhered onto the substrate was measured using a particle counter. Consequently, the number of particles on the silicon substrate was 2 particles.

Comparative Example 2

A Co powder having an average grain size of 3 μm, a Cr powder having an average grain size of 5 μm and a Pt powder having an average grain size of 2 μm were prepared as metal raw material powders, and a TiO$_2$ powder having an average grain size of 1 μm, a SiO$_2$ powder having an average grain size of 1 μm and a Cr$_2$O$_3$ powder having an average grain size of 3 μm were prepared as oxide raw material powders. Subsequently, these powders were weighed to be 2100.0 g in total so that the composition of the overall sputtering target resulted in the following composition ratio.
  (Target composition): 65Co-12Cr-14Pt-3TiO$_2$-3SiO$_2$-3Cr$_2$O$_3$ (mol %)

The weighed powders were placed in a ball mill pot having a capacity of 10 liters together with zirconia balls as the grinding medium, and mixed by being rotated for 20 hours. The thus obtained mixed powder was filled in a carbon mold, and hot pressed in a vacuum atmosphere under the following conditions; namely, temperature of 1100° C., holding time of 2 hours, and pressure of 30 MPa, whereby a sintered compact having a relative density of 98.6% was obtained. In addition, the obtained sintered compact was machined with a lathe to obtain a disk-shaped sputtering target having a diameter of 180 mm, and a thickness of 5 mm.

Upon observing the microstructure of the sputtering target of Comparative Example 2, it was confirmed that TiO$_2$, SiO$_2$ and Cr$_2$O$_3$ were dispersed in a Co—Cr—Pt alloy. In addition, the structure of the polished surface of the target was photographed in a visual field size of 100 μm×75 μm at 8 arbitrarily selected locations on the target structure surface, and the captured structure photograph was binarized using image processing software to obtain a mean area per oxide particle, whereby the result was 2.3 μm$^2$, and the oxides had coarsened in comparison to Examples 2 and 3.

Subsequently, this target was mounted on a DC magnetron sputtering device and sputtered. The sputtering conditions were a sputtering power of 1 kw and an Ar gas pressure of 1.5 Pa, and, after performing pre-sputtering at 2 kWhr, a film was sputtered on a silicon substrate having a 4-inch diameter with a target film thickness of 1000 nm. In addition, the number of particles that adhered onto the substrate was measured using a particle counter. Consequently, the number of particles on the silicon substrate was 15 particles, and the number of particles had increased in comparison to Examples 2 and 3.

Comparative Example 3

A Co powder having an average grain size of 3 μm, a Cr powder having an average grain size of 5 μm and a Pt powder having an average grain size of 2 μm were prepared as metal raw material powders, and a TiO$_2$ powder having an average grain size of 1 μm, a SiO$_2$ powder having an average grain size of 1 μm and a Cr$_2$O$_3$ powder having an average grain size of 3 μm were prepared as oxide raw material powders. In addition, the respective powders were each weighed to be 2000 g based on the following composition ratio to prepare a mixed powder A and a mixed powder B.
  (Mixed powder A): 81.76Co-9.12Pt-4.56TiO$_2$-4.56Cr$_2$O$_3$ (mol %)
  (Mixed powder B): 32.75Co-35.09Cr-23.39Pt-8.77SiO$_2$ (mol %)

The weighed powders were respectively placed in a ball mill pot having a capacity of 10 liters together with zirconia balls as the grinding medium, and mixed by being rotated for 20 hours. Thereafter, only the mixed powder A was filled in a carbon mold, and hot pressed in a vacuum atmosphere under the following conditions; namely, temperature of 1000° C., holding time of 2 hours, and pressure of 30 MPa, to obtain a sintered compact (sintered compact A). Subsequently, the obtained sintered compact was pulverized using a jaw crusher and a stone mill-type grinder, and thereafter classified using an air classifier to obtain a sintered compact powder A having an average grain size of 18 μm.

Subsequently, the sintered compact powder A and the mixed powder B were respectively weighed; specifically, the sintered compact powder A was weighed to be 1312.0 g and the mixed powder B was weighed to be 788.0 g, so that the composition of the overall sputtering target resulted in the following composition ratio.
  (Target composition): 65Co-12Cr-14Pt-3TiO$_2$-3SiO$_2$-3Cr$_2$O$_3$ (mol %)

The weighed powders were placed in a planetary-screw mixer having a ball capacity of approximately 7 liters, and mixed for 20 minutes to obtain a mixed powder for preparing a secondary sintered compact. The thus obtained mixed powder for preparing a secondary sintered compact was filled in a carbon mold, and hot pressed in a vacuum atmosphere under the following conditions; namely, temperature of 1100° C., holding time of 2 hours, and pressure of 30 MPa, whereby a sintered compact having a relative density of 97.6% was obtained. In addition, the obtained sintered compact was machined with a lathe to obtain a disk-shaped sputtering target having a diameter of 180 mm, and a thickness of 5 mm.

Upon observing the microstructure of the sputtering target of Comparative Example 3, the structure did not enable the confirmation of a clear differentiation of regions (non-Cr-based regions) in which TiO$_2$ and Cr$_2$O$_3$ are dispersed in Co—Pt, and a region (Cr-based region) in which SiO$_2$ is dispersed in a Co—Cr—Pt alloy.

In addition, the structure of the polished surface of the target was photographed in a visual field size of 100 μm×75 μm at 8 arbitrarily selected locations on the target structure surface, and the captured structure photograph was binarized using image processing software to obtain a mean area per oxide particle, whereby the result was 2.1 μm$^2$, and the oxides had coarsened in comparison to Examples 2 and 3.

Subsequently, this target was mounted on a DC magnetron sputtering device and sputtered. The sputtering conditions were a sputtering power of 1 kw and an Ar gas pressure of 1.5 Pa, and, after performing pre-sputtering at 2 kWhr, a film was sputtered on a silicon substrate having a 4-inch diameter with a target film thickness of 1000 nm. In addition, the number of particles that adhered onto the substrate was measured using a particle counter. Consequently, the number of particles on the silicon substrate was 10 particles, and the number of particles had increased in comparison to Examples 2 and 3.

Comparative Example 4

A Co powder having an average grain size of 3 μm, a Cr powder having an average grain size of 5 μm and a Pt powder having an average grain size of 2 μm were prepared as metal raw material powders, and a $TiO_2$ powder having an average grain size of 1 μm, a $SiO_2$ powder having an average grain size of 1 μm and a $Cr_2O_3$ powder having an average grain size of 3 μm were prepared as oxide raw material powders. In addition, the respective powders were each weighed to be 2000 g based on the following composition ratio to prepare a mixed powder A and a mixed powder B.

(Mixed powder A): 75.34Co-16.44Pt-4.11$SiO_2$-4.11$Cr_2O_3$ (mol %)
(Mixed powder B): 37.04Co-44.44Cr-7.41Pt-11.11$TiO_2$ (mol %)

The weighed powders were respectively placed in a ball mill pot having a capacity of 10 liters together with zirconia balls as the grinding medium, and mixed by being rotated for 20 hours. Thereafter, only the mixed powder A was filled in a carbon mold, and hot pressed in a vacuum atmosphere under the following conditions; namely, temperature of 1100° C., holding time of 2 hours, and pressure of 30 MPa, to obtain a sintered compact (sintered compact A). Subsequently, the obtained sintered compact was pulverized using a jaw crusher and a stone mill-type grinder, and thereafter sieved using sieves having a sieve opening of 38 μm and 106 μm to obtain a sintered compact powder A having a grain size of 38 to 106 μm.

Subsequently, the sintered compact powder A and the mixed powder B were respectively weighed; specifically, the sintered compact powder A was weighed to be 1619.9 g and the mixed powder B was weighed to be 480.1 g, so that the composition of the overall sputtering target resulted in the following composition ratio.

(Target composition): 65Co-12Cr-14Pt-3$TiO_2$-3$SiO_2$-3$Cr_2O_3$ (mol %)

The weighed powders were placed in a planetary-screw mixer having a ball capacity of approximately 7 liters, and mixed for 20 minutes to obtain a mixed powder for preparing a secondary sintered compact. The thus obtained mixed powder for preparing a secondary sintered compact was filled in a carbon mold, and hot pressed in a vacuum atmosphere under the following conditions; namely, temperature of 1000° C., holding time of 2 hours, and pressure of 30 MPa, whereby a sintered compact having a relative density of 98.1% was obtained. In addition, the obtained sintered compact was machined with a lathe to obtain a disk-shaped sputtering target having a diameter of 180 mm, and a thickness of 5 mm.

Upon observing the microstructure of the sputtering target of Comparative Example 4, it was confirmed that the structure included regions in which $SiO_2$ and $Cr_2O_3$ are dispersed in Co—Pt, and a region in which $TiO_2$ is dispersed in a Co—Cr—Pt alloy, and the regions in which $SiO_2$ and $Cr_2O_3$ are dispersed in Co—Pt are scattered in the region in which $TiO_2$ is dispersed in a Co—Cr—Pt alloy.

In addition, the structure of the polished surface of the target was photographed in a visual field size of 100 μm×75 μm at 8 arbitrarily selected locations on the target structure surface, and the captured structure photograph was binarized using image processing software to obtain a mean area per oxide particle, whereby the result was 2.6 $μm^2$, and the oxides had coarsened in comparison to Examples 2 and 3.

Subsequently, this target was mounted on a DC magnetron sputtering device and sputtered. The sputtering conditions were a sputtering power of 1 kw and an Ar gas pressure of 1.5 Pa, and, after performing pre-sputtering at 2 kWhr, a film was sputtered on a silicon substrate having a 4-inch diameter with a target film thickness of 1000 nm. In addition, the number of particles that adhered onto the substrate was measured using a particle counter. Consequently, the number of particles on the silicon substrate was 18 particles, and the number of particles had increased in comparison to Examples 2 and 3.

Example 4

A Co powder having an average grain size of 3 μm, a Cr powder having an average grain size of 5 μm, a Pt powder having an average grain size of 2 μm and a B powder having an average grain size of 10 μm were prepared as metal raw material powders, and a $TiO_2$ powder having an average grain size of 1 μm and a $SiO_2$ powder having an average grain size of 1 μm were prepared as oxide raw material powders. In addition, the respective powders were each weighed to be 2000 g based on the following composition ratio to prepare a mixed powder A and a mixed powder B.

(Mixed powder A): 80.96Co-9.52Pt-9.52$TiO_2$ (mol %)
(Mixed powder B): 53.45Co-20.69Cr-13.79Pt-5.17B-6.9$SiO_2$ (mol %)

The weighed powders were respectively placed in a ball mill pot having a capacity of 10 liters together with zirconia balls as the grinding medium, and mixed by being rotated for 20 hours. Thereafter, only the mixed powder A was filled in a carbon mold, and hot pressed in a vacuum atmosphere under the following conditions; namely, temperature of 1000° C., holding time of 2 hours, and pressure of 30 MPa, to obtain a sintered compact (sintered compact A). Subsequently, the obtained sintered compact was pulverized using a jaw crusher and a stone mill-type grinder, and thereafter sieved using sieves having a sieve opening of 38 μm and 106 μm to obtain a sintered compact powder A having a grain size of 38 to 106 μm.

Subsequently, the sintered compact powder A and the mixed powder B were respectively weighed; specifically, the sintered compact powder A was weighed to be 1217.8 g and the mixed powder B was weighed to be 882.2 g, so that the composition of the overall sputtering target resulted in the following composition ratio.

(Target composition): 65Co-12Cr-12Pt-3B-4$TiO_2$-4$SiO_2$ (mol %)

The weighed powders were placed in a planetary-screw mixer having a ball capacity of approximately 7 liters, and mixed for 20 minutes to obtain a mixed powder for preparing a secondary sintered compact. The thus obtained mixed powder for preparing a secondary sintered compact was filled in a carbon mold, and hot pressed in a vacuum atmosphere under the following conditions; namely, temperature of 1000° C., holding time of 2 hours, and pressure of 30 MPa, whereby a sintered compact having a relative density of 96.5% was obtained. In addition, the obtained sintered compact was machined with a lathe to obtain a disk-shaped sputtering target having a diameter of 180 mm, and a thickness of 5 mm.

Upon observing the microstructure of the sputtering target of Example 4, it was confirmed that the structure included regions (non-Cr-based regions) in which $TiO_2$ is dispersed in Co—Pt, and a region (Cr-based region) in which $SiO_2$ is dispersed in a Co—Cr—Pt—B alloy, and the non-Cr-based regions are scattered in the Cr-based region.

In addition, the structure of the polished surface of the target was photographed in a visual field size of 100 μm×75 μm at 8 arbitrarily selected locations on the target structure surface, and the captured structure photograph was binarized using image processing software to obtain a mean area per oxide particle, whereby the result was 1.8 μm².

Subsequently, this target was mounted on a DC magnetron sputtering device and sputtered. The sputtering conditions were a sputtering power of 1 kw and an Ar gas pressure of 1.5 Pa, and, after performing pre-sputtering at 2 kWhr, a film was sputtered on a silicon substrate having a 4-inch diameter with a target film thickness of 1000 nm. In addition, the number of particles that adhered onto the substrate was measured using a particle counter. Consequently, the number of particles on the silicon substrate was 6 particles.

Comparative Example 5

A Co powder having an average grain size of 3 μm, a Cr powder having an average grain size of 5 μm, a Pt powder having an average grain size of 2 μm and a B powder having an average grain size of 10 μm were prepared as metal raw material powders, and a $TiO_2$ powder having an average grain size of 1 μm and a $SiO_2$ powder having an average grain size of 1 μm were prepared as oxide raw material powders. Subsequently, these powders were weighed to be 2100.0 g in total so that the composition of the overall sputtering target resulted in the following composition ratio.

(Target composition): 65Co-12Cr-12Pt-3B-4$TiO_2$-4$SiO_2$ (mol %)

The weighed powders were placed in a ball mill pot having a capacity of 10 liters together with zirconia balls as the grinding medium, and mixed by being rotated for 20 hours. The thus obtained mixed powder was filled in a carbon mold, and hot pressed in a vacuum atmosphere under the following conditions; namely, temperature of 1000° C., holding time of 2 hours, and pressure of 30 MPa, whereby a sintered compact having a relative density of 96.2% was obtained. In addition, the obtained sintered compact was machined with a lathe to obtain a disk-shaped sputtering target having a diameter of 180 mm, and a thickness of 5 mm.

Upon observing the microstructure of the sputtering target of Comparative Example 5, it was confirmed that $TiO_2$ and $SiO_2$ were dispersed in a Co—Cr—Pt—B alloy. In addition, the structure of the polished surface of the target was photographed in a visual field size of 100 μm×75 μm at 8 arbitrarily selected locations on the target structure surface, and the captured structure photograph was binarized using image processing software to obtain a mean area per oxide particle, whereby the result was 2.5 μm², and the oxides had coarsened in comparison to Example 4.

Subsequently, this target was mounted on a DC magnetron sputtering device and sputtered. The sputtering conditions were a sputtering power of 1 kw and an Ar gas pressure of 1.5 Pa, and, after performing pre-sputtering at 2 kWhr, a film was sputtered on a silicon substrate having a 4-inch diameter with a target film thickness of 1000 nm. In addition, the number of particles that adhered onto the substrate was measured using a particle counter. Consequently, the number of particles on the silicon substrate was 19 particles, and the number of particles had increased in comparison to Example 4.

Example 5

A Co powder having an average grain size of 3 μm, a Cr powder having an average grain size of 5 μm, a Pt powder having an average grain size of 2 μm and a Ru powder having an average grain size of 10 μm were prepared as metal raw material powders, and a $TiO_2$ powder having an average grain size of 1 μm, a $SiO_2$ powder having an average grain size of 1 μm and a $Cr_2O_3$ powder having an average grain size of 3 μm were prepared as oxide raw material powders. In addition, the respective powders were each weighed to be 2000 g based on the following composition ratio to prepare a mixed powder A and a mixed powder B.

(Mixed powder A): 89.29Co-10.71$TiO_2$ (mol %)
(Mixed powder B): 54.16Co-16.67Cr-13.89Pt-6.94Ru-4.17$SiO_2$-4.17$Cr_2O_3$ (mol %)

The weighed powders were respectively placed in a ball mill pot having a capacity of 10 liters together with zirconia balls as the grinding medium, and mixed by being rotated for 20 hours. Thereafter, only the mixed powder A was filled in a carbon mold, and hot pressed in a vacuum atmosphere under the following conditions; namely, temperature of 1000° C., holding time of 2 hours, and pressure of 30 MPa, to obtain a sintered compact (sintered compact A). Subsequently, the obtained sintered compact was pulverized using a jaw crusher and a stone mill-type grinder, and thereafter sieved using sieves having a sieve opening of 38 μm and 106 μm to obtain a sintered compact powder A having a grain size of 38 to 106 μm.

Subsequently, the sintered compact powder A and the mixed powder B were respectively weighed; specifically, the sintered compact powder A was weighed to be 465.5 g and the mixed powder B was weighed to be 1634.5 g, so that the composition of the overall sputtering target resulted in the following composition ratio.

(Target composition): 64Co-12Cr-10Pt-5Ru-3$TiO_2$-3$SiO_2$-3$Cr_2O_3$ (mol %)

The weighed powders were placed in a planetary-screw mixer having a ball capacity of approximately 7 liters, and mixed for 20 minutes to obtain a mixed powder for preparing a secondary sintered compact. The thus obtained mixed powder for preparing a secondary sintered compact was filled in a carbon mold, and hot pressed in a vacuum atmosphere under the following conditions; namely, temperature of 1100° C., holding time of 2 hours, and pressure of 30 MPa, whereby a sintered compact having a relative density of 98.8% was obtained. In addition, the obtained sintered compact was machined with a lathe to obtain a disk-shaped sputtering target having a diameter of 180 mm, and a thickness of 5 mm.

Upon observing the microstructure of the sputtering target of Example 5, it was confirmed that the structure included regions (non-Cr-based regions) in which $TiO_2$ is dispersed in Co, and a region (Cr-based region) in which $SiO_2$ and $Cr_2O_3$ are dispersed in a Co—Cr—Pt—Ru alloy, and the non-Cr-based regions are scattered in the Cr-based region.

In addition, the structure of the polished surface of the target was photographed in a visual field size of 100 μm×75 μm at 8 arbitrarily selected locations on the target structure surface, and the captured structure photograph was binarized using image processing software to obtain a mean area per oxide particle, whereby the result was 1.1 μm².

Subsequently, this target was mounted on a DC magnetron sputtering device and sputtered. The sputtering conditions were a sputtering power of 1 kw and an Ar gas pressure of 1.5 Pa, and, after performing pre-sputtering at 2 kWhr, a film was sputtered on a silicon substrate having a 4-inch diameter with a target film thickness of 1000 nm. In addition, the number of particles that adhered onto the substrate was measured using a particle counter. Consequently, the number of particles on the silicon substrate was 2 particles.

Comparative Example 6

A Co powder having an average grain size of 3 μm, a Cr powder having an average grain size of 5 μm, a Pt powder having an average grain size of 2 μm, and a Ru powder having an average grain size of 10 μm were prepared as metal raw material powders, and a $TiO_2$ powder having an average grain size of 1 μm, a $SiO_2$ powder having an average grain size of 1 μm and a $Cr_2O_3$ powder having an average grain size of 3 μm were prepared as oxide raw material powders. Subsequently, these powders were weighed to be 2100.0 g in total so that the composition of the overall sputtering target resulted in the following composition ratio.
(Target composition): 64Co-12Cr-10Pt-5Ru-3$TiO_2$-3$SiO_2$-3$Cr_2O_3$ (mol %)
The weighed powders were placed in a ball mill pot having a capacity of 10 liters together with zirconia balls as the grinding medium, and mixed by being rotated for 20 hours. The thus obtained mixed powder was filled in a carbon mold, and hot pressed in a vacuum atmosphere under the following conditions; namely, temperature of 1100° C., holding time of 2 hours, and pressure of 30 MPa, whereby a sintered compact having a relative density of 98.9% was obtained. In addition, the obtained sintered compact was machined with a lathe to obtain a disk-shaped sputtering target having a diameter of 180 mm, and a thickness of 5 mm.

Upon observing the microstructure of the sputtering target of Comparative Example 6, it was confirmed that $TiO_2$, $SiO_2$ and $Cr_2O_3$ were dispersed in a Co—Cr—Pt—Ru alloy. In addition, the structure of the polished surface of the target was photographed in a visual field size of 100 μm×75 μm at 8 arbitrarily selected locations on the target structure surface, and the captured structure photograph was binarized using image processing software to obtain a mean area per oxide particle, whereby the result was 2.0 μm$^2$, and the oxides had coarsened in comparison to Example 5.

Subsequently, this target was mounted on a DC magnetron sputtering device and sputtered. The sputtering conditions were a sputtering power of 1 kw and an Ar gas pressure of 1.5 Pa, and, after performing pre-sputtering at 2 kWhr, a film was sputtered on a silicon substrate having a 4-inch diameter with a target film thickness of 1000 nm. In addition, the number of particles that adhered onto the substrate was measured using a particle counter. Consequently, the number of particles on the silicon substrate was 12 particles, and the number of particles had increased in comparison to Example 5.

Example 6

A Co powder having an average grain size of 3 μm, a Cr powder having an average grain size of 5 μm, and a Pt powder having an average grain size of 2 μm were prepared as metal raw material powders, and a $TiO_2$ powder having an average grain size of 1 μm, a $SiO_2$ powder having an average grain size of 1 μm and a $B_2O_3$ powder having an average grain size of 10 μm were prepared as oxide raw material powders. In addition, the respective powders were each weighed to be 2000 g based on the following composition ratio to prepare a mixed powder A and a mixed powder B.
(Mixed powder A): 89.29Co-10.71$TiO_2$ (mol %)
(Mixed powder B): 61.11Co-16.67Cr-13.89Pt-4.17$SiO_2$-4.17$B_2O_3$ (mol %)
The weighed powders were respectively placed in a ball mill pot having a capacity of 10 liters together with zirconia balls as the grinding medium, and mixed by being rotated for 20 hours. Thereafter, only the mixed powder A was filled in a carbon mold, and hot pressed in a vacuum atmosphere under the following conditions; namely, temperature of 1000° C., holding time of 2 hours, and pressure of 30 MPa, to obtain a sintered compact (sintered compact A). Subsequently, the obtained sintered compact was pulverized using a jaw crusher and a stone mill-type grinder, and thereafter sieved using sieves having a sieve opening of 38 μm and 106 μm to obtain a sintered compact powder A having a grain size of 38 to 106 μm.

Subsequently, the sintered compact powder A and the mixed powder B were respectively weighed; specifically, the sintered compact powder A was weighed to be 471.4 g and the mixed powder B was weighed to be 1528.6 g, so that the composition of the overall sputtering target resulted in the following composition ratio.
(Target composition): 69Co-12Cr-10Pt-3$TiO_2$-3$SiO_2$-3$B_2O_3$ (mol %)
The weighed powders were placed in a planetary-screw mixer having a ball capacity of approximately 7 liters, and mixed for 20 minutes to obtain a mixed powder for preparing a secondary sintered compact. The thus obtained mixed powder for preparing a secondary sintered compact was filled in a carbon mold, and hot pressed in a vacuum atmosphere under the following conditions; namely, temperature of 850° C., holding time of 2 hours, and pressure of 30 MPa, whereby a sintered compact having a relative density of 98.3% was obtained. In addition, the obtained sintered compact was machined with a lathe to obtain a disk-shaped sputtering target having a diameter of 180 mm, and a thickness of 5 mm.

Upon observing the microstructure of the sputtering target of Example 6, it was confirmed that the structure included regions (non-Cr-based regions) in which $TiO_2$ is dispersed in Co, and a region (Cr-based region) in which $SiO_2$ and $B_2O_3$ are dispersed in a Co—Cr—Pt alloy, and the non-Cr-based regions are scattered in the Cr-based region.

In addition, the structure of the polished surface of the target was photographed in a visual field size of 100 μm×75 μm at 8 arbitrarily selected locations on the target structure surface, and the captured structure photograph was binarized using image processing software to obtain a mean area per oxide particle, whereby the result was 1.9 μm$^2$.

Subsequently, this target was mounted on a DC magnetron sputtering device and sputtered. The sputtering conditions were a sputtering power of 1 kw and an Ar gas pressure of 1.5 Pa, and, after performing pre-sputtering at 2 kWhr, a film was sputtered on a silicon substrate having a 4-inch diameter with a target film thickness of 1000 nm. In addition, the number of particles that adhered onto the substrate was measured using a particle counter. Consequently, the number of particles on the silicon substrate was 6 particles.

Comparative Example 7

A Co powder having an average grain size of 3 μm, a Cr powder having an average grain size of 5 μm, and a Pt powder having an average grain size of 2 μm were prepared as metal raw material powders, and a TiO$_2$ powder having an average grain size of 1 μm, a SiO$_2$ powder having an average grain size of 1 μm and a B$_2$O$_3$ powder having an average grain size of 10 μm were prepared as oxide raw material powders. Subsequently, these powders were weighed to be 2000.0 g in total so that the composition of the overall sputtering target resulted in the following composition ratio.

(Target composition): 69Co-12Cr-10Pt-3TiO$_2$-3SiO$_2$-3B$_2$O$_3$ (mol %)

The weighed powders were placed in a ball mill pot having a capacity of 10 liters together with zirconia balls as the grinding medium, and mixed by being rotated for 20 hours. The thus obtained mixed powder was filled in a carbon mold, and hot pressed in a vacuum atmosphere under the following conditions; namely, temperature of 850° C., holding time of 2 hours, and pressure of 30 MPa, whereby a sintered compact having a relative density of 98.7% was obtained. In addition, the obtained sintered compact was machined with a lathe to obtain a disk-shaped sputtering target having a diameter of 180 mm, and a thickness of 5 mm.

Upon observing the microstructure of the sputtering target of Comparative Example 7, it was confirmed that TiO$_2$ and SiO$_2$ and B$_2$O$_3$ were dispersed in a Co—Cr—Pt alloy. In addition, the structure of the polished surface of the target was photographed in a visual field size of 100 μm×75 μm at 8 arbitrarily selected locations on the target structure surface, and the captured structure photograph was binarized using image processing software to obtain a mean area per oxide particle, whereby the result was 3.1 μm$^2$, and the oxides had coarsened in comparison to Example 6.

Subsequently, this target was mounted on a DC magnetron sputtering device and sputtered. The sputtering conditions were a sputtering power of 1 kw and an Ar gas pressure of 1.5 Pa, and, after performing pre-sputtering at 2 kWhr, a film was sputtered on a silicon substrate having a 4-inch diameter with a target film thickness of 1000 nm. In addition, the number of particles that adhered onto the substrate was measured using a particle counter. Consequently, the number of particles on the silicon substrate was 18 particles, and the number of particles was larger in comparison to Example 6.

Example 7

A Co powder having an average grain size of 3 μm, a Cr powder having an average grain size of 5 μm, and a Pt powder having an average grain size of 2 μm were prepared as metal raw material powders, and a TiO$_2$ powder having an average grain size of 1 μm, a SiO$_2$ powder having an average grain size of 1 μm and a MnO powder having an average grain size of 3 μm were prepared as oxide raw material powders. In addition, the respective powders were each weighed to be 2000 g based on the following composition ratio to prepare a mixed powder A and a mixed powder B.

(Mixed powder A): 89.29Co-10.71TiO$_2$ (mol %)
(Mixed powder B): 61.10Co-16.67Cr-13.89Pt-2.78SiO$_2$-5.56MnO (mol %)

The weighed powders were respectively placed in a ball mill pot having a capacity of 10 liters together with zirconia balls as the grinding medium, and mixed by being rotated for 20 hours. Thereafter, only the mixed powder A was filled in a carbon mold, and hot pressed in a vacuum atmosphere under the following conditions; namely, temperature of 1000° C., holding time of 2 hours, and pressure of 30 MPa, to obtain a sintered compact (sintered compact A). Subsequently, the obtained sintered compact was pulverized using a jaw crusher and a stone mill-type grinder, and thereafter sieved using sieves having a sieve opening of 38 μm and 106 μm to obtain a sintered compact powder A having a grain size of 38 to 106 μm.

Subsequently, the sintered compact powder A and the mixed powder B were respectively weighed; specifically, the sintered compact powder A was weighed to be 470.2 g and the mixed powder B was weighed to be 1529.8 g, so that the composition of the overall sputtering target resulted in the following composition ratio.

(Target composition): 69Co-12Cr-10Pt-3TiO$_2$-2SiO$_2$-4MnO (mol %)

The weighed powders were placed in a planetary-screw mixer having a ball capacity of approximately 7 liters, and mixed for 20 minutes to obtain a mixed powder for preparing a secondary sintered compact. The thus obtained mixed powder for preparing a secondary sintered compact was filled in a carbon mold, and hot pressed in a vacuum atmosphere under the following conditions; namely, temperature of 950° C., holding time of 2 hours, and pressure of 30 MPa, whereby a sintered compact having a relative density of 98.2% was obtained. In addition, the obtained sintered compact was machined with a lathe to obtain a disk-shaped sputtering target having a diameter of 180 mm, and a thickness of 5 mm.

Upon observing the microstructure of the sputtering target of Example 7, it was confirmed that the structure included regions (non-Cr-based regions) in which TiO$_2$ is dispersed in Co, and a region (Cr-based region) in which SiO$_2$ and MnO are dispersed in a Co—Cr—Pt alloy, and the non-Cr-based regions are scattered in the Cr-based region.

In addition, the structure of the polished surface of the target was photographed in a visual field size of 100 μm×75 μm at 8 arbitrarily selected locations on the target structure surface, and the captured structure photograph was binarized using image processing software to obtain a mean area per oxide particle, whereby the result was 1.6 μm$^2$.

Subsequently, this target was mounted on a DC magnetron sputtering device and sputtered. The sputtering conditions were a sputtering power of 1 kw and an Ar gas pressure of 1.5 Pa, and, after performing pre-sputtering at 2 kWhr, a film was sputtered on a silicon substrate having a 4-inch diameter with a target film thickness of 1000 nm. In addition, the number of particles that adhered onto the substrate was measured using a particle counter. Consequently, the number of particles on the silicon substrate was 6 particles.

Comparative Example 8

A Co powder having an average grain size of 3 μm, a Cr powder having an average grain size of 5 μm, and a Pt powder having an average grain size of 2 μm were prepared as metal raw material powders, and a TiO$_2$ powder having an average grain size of 1 μm, a SiO$_2$ powder having an average grain size of 1 μm and a MnO powder having an average grain size of 3 μm were prepared as oxide raw material powders. Subsequently, these powders were weighed to be 2000.0 g in total so that the composition of the overall sputtering target resulted in the following composition ratio.

(Target composition): 69Co-12Cr-10Pt-3TiO$_2$-2SiO$_2$-4MnO (mol %)

The weighed powders were placed in a ball mill pot having a capacity of 10 liters together with zirconia balls as the grinding medium, and mixed by being rotated for 20 hours. The thus obtained mixed powder was filled in a carbon mold, and hot pressed in a vacuum atmosphere under the following conditions; namely, temperature of 950° C., holding time of 2 hours, and pressure of 30 MPa, whereby a sintered compact having a relative density of 98.7% was obtained. In addition, the obtained sintered compact was machined with a lathe to obtain a disk-shaped sputtering target having a diameter of 180 mm, and a thickness of 5 mm.

Upon observing the microstructure of the sputtering target of Comparative Example 8, it was confirmed that $TiO_2$ and $SiO_2$ and MnO were dispersed in a Co—Cr—Pt alloy. In addition, the structure of the polished surface of the target was photographed in a visual field size of 100 μm×75 μm at 8 arbitrarily selected locations on the target structure surface, and the captured structure photograph was binarized using image processing software to obtain a mean area per oxide particle, whereby the result was 2.9 μm$^2$, and the oxides had coarsened in comparison to Example 6.

Subsequently, this target was mounted on a DC magnetron sputtering device and sputtered. The sputtering conditions were a sputtering power of 1 kw and an Ar gas pressure of 1.5 Pa, and, after performing pre-sputtering at 2 kWhr, a film was sputtered on a silicon substrate having a 4-inch diameter with a target film thickness of 1000 nm. In addition, the number of particles that adhered onto the substrate was measured using a particle counter. Consequently, the number of particles on the silicon substrate was 13 particles, and the number of particles was larger in comparison to Example 6.

TABLE 1

| | Target Composition (mol %) | Mixed Powder A (mol %) |
|---|---|---|
| Example 1 | 80Co—12Cr—4TiO$_2$—4SiO$_2$ | 90.5Co—9.5TiO$_2$ |
| Comparative Example 1 | 80Co—12Cr—4TiO$_2$—4SiO$_2$ | — |
| Example 2 | 65Co—12Cr—14Pt—3TiO$_2$—3SiO$_2$—3Cr$_2$O$_3$ | 68.15Co—22.29Pt—4.78TiO$_2$—4.78Cr$_2$O$_3$ |
| Example 3 | 65Co—12Cr—14Pt—3TiO$_2$—3SiO$_2$—3Cr$_2$O$_3$ | 81.76Co—9.12Pt—4.56TiO$_2$—4.56Cr$_2$O$_3$ |
| Comparative Example 2 | 65Co—12Cr—14Pt—3TiO$_2$—3SiO$_2$—3Cr$_2$O$_3$ | — |
| Comparative Example 3 | 65Co—12Cr—14Pt—3TiO$_2$—3SiO$_2$—3Cr$_2$O$_3$ | 81.76Co—9.12Pt—4.56TiO$_2$—4.56Cr$_2$O$_3$ |
| Comparative Example 4 | 65Co—12Cr—14Pt—3TiO$_2$—3SiO$_2$—3Cr$_2$O$_3$ | 75.34Co—16.44Pt—4.11SiO$_2$—4.11Cr$_2$O$_3$ |
| Example 4 | 65Co—12Cr—12Pt—3B—4TiO$_2$—4SiO$_2$ | 80.96Co—9.52Pt—9.52TiO$_2$ |
| Comparative Example 5 | 65Co—12Cr—12Pt—3B—4TiO$_2$—4SiO$_2$ | — |
| Example 5 | 64Co—12Cr—10Pt—5Ru—3TiO$_2$—3SiO$_2$—3Cr$_2$O$_3$ | 89.29Co—10.71TiO$_2$ |
| Comparative Example 6 | 64Co—12Cr—10Pt—5Ru—3TiO$_2$—3SiO$_2$—3Cr$_2$O$_3$ | — |
| Example 6 | 69Co—12Cr—10Pt—3TiO$_2$—3SiO$_2$—3B$_2$O$_3$ | 89.29Co—10.71TiO$_2$ |
| Comparative Example 7 | 69Co—12Cr—10Pt—3TiO$_2$—3SiO$_2$—3B$_2$O$_3$ | — |
| Example 7 | 69Co—12Cr—10Pt—3TiO$_2$—2SiO$_2$—4MnO | 89.29Co—10.71TiO$_2$ |
| Comparative Example 8 | 69Co—12Cr—10Pt—3TiO$_2$—2SiO$_2$—4MnO | — |

| | Mixed Powder B (mol %) | Grain Size of Sintered Compact Powder A (μm) | Mean Area of Oxide (μm$^2$) | Number of Particles (Particles) |
|---|---|---|---|---|
| Example 1 | 72.36Co—20.73Cr—6.91SiO$_2$ | 50-150 | 1.1 | 5 |
| Comparative Example 1 | 80Co—12Cr—4TiO$_2$—4SiO$_2$ | — | 2.1 | 13 |
| Example 2 | 59.68Co—32.26Cr—8.06SiO$_2$ | 38-106 | 1.4 | 3 |
| Example 3 | 32.75Co—35.09Cr—23.39Pt—8.77SiO$_2$ | 38-106 | 1.5 | 2 |
| Comparative Example 2 | 65Co—12Cr—14Pt—3TiO$_2$—3SiO$_2$—3Cr$_2$O$_3$ | — | 2.3 | 15 |
| Comparative Example 3 | 32.75Co—35.09Cr—23.39Pt—8.77SiO$_2$ | 18 | 2.1 | 10 |
| Comparative Example 4 | 37.04Co—44.44Cr—7.41Pt—11.11TiO$_2$ | 38-106 | 2.6 | 18 |
| Example 4 | 53.45Co—20.69Cr—13.79Pt—5.17B—6.9SiO$_2$ | 38-106 | 1.8 | 6 |
| Comparative Example 5 | 65Co—12Cr—12Pt—3B—4TiO$_2$—4SiO$_2$ | — | 2.5 | 19 |
| Example 5 | 54.16Co—16.67Cr—13.89Pt—6.94Ru—4.17SiO$_2$—4.17Cr$_2$O$_3$ | 38-106 | 1.1 | 2 |
| Comparative Example 6 | 64Co—12Cr—10Pt—5Ru—3TiO$_2$—3SiO$_2$—3Cr$_2$O$_3$ | — | 2.0 | 12 |
| Example 6 | 61.1Co—16.67Cr—13.89Pt—4.17SiO$_2$—4.17B$_2$O$_3$ | 38-106 | 1.9 | 6 |
| Comparative Example 7 | 69Co—12Cr—10Pt—3TiO$_2$—3SiO$_2$—3B$_2$O$_3$ | — | 3.1 | 18 |
| Example 7 | 61.1Co—16.67Cr—13.89Pt—2.78SiO$_2$—5.56MnO | 38-106 | 1.6 | 6 |
| Comparative Example 8 | 69Co—12Cr—10Pt—3TiO$_2$—2SiO$_2$—4MnO | — | 2.9 | 13 |

In all cases of Examples 1 to 7, the mean area of individual oxide particles was less than 2.0 µm², and it was confirmed that the oxides are finely dispersed. It should be easy to understand that this kind of structure plays an extremely important role for suppressing the amount of particles that are generated during sputtering, and improving the yield during deposition.

Since the sputtering target and production method thereof according to the present invention can suppress the formation of coarse complex oxide grains and improve the dispersibility of oxides, the present invention yields superior effects of being able to reduce the amount of particles that are generated during sputtering, and improve the yield during deposition. Accordingly, the present invention is useful as a sputtering target for forming a granular film.

The invention claimed is:

1. A sputtering target containing, as metal components, 0.5 to 45 mol % of Cr and remainder being Co, and containing, as non-metal components, two or more types of oxides including Ti oxide, wherein a structure of the sputtering target is configured from non-Cr-based regions in which metal Cr does not exist and where oxides including at least Ti oxide are dispersed in Co, and a Cr-based region where oxides other than Ti oxide are dispersed in Cr or Co—Cr, and wherein the non-Cr-based regions are scattered in the Cr-based region.

2. A sputtering target containing, as metal components, 0.5 to 30 mol % of Cr, 0.5 to 30 mol % of Pt, and remainder being Co, and containing, as non-metal components, two or more types of oxides including Ti oxide, wherein a structure of the sputtering target is configured from non-Cr-based regions in which metal Cr does not exist and where oxides including at least Ti oxide are dispersed in Co or Co—Pt, and a Cr-based region where oxides other than Ti oxide are dispersed in one or more types of phases of Co—Cr, Cr—Pt, and Co—Cr—Pt, and wherein the non-Cr-based regions are scattered in the Cr-based region.

3. The sputtering target according to claim 2, wherein the two or more types of oxides include oxides of one or more types of elements selected from B, Mg, Al, Si, Cr, Zr, Nb, and Ta.

4. The sputtering target according to claim 3, wherein a content of the oxides in the sputtering target is, based on a volume ratio, 20% or more and less than 50%.

5. The sputtering target according to claim 4, wherein the sputtering target contains, as metal components, one or more types of elements selected from B, Cu, Mo, Ru, Ta, and W.

6. A method of producing a sputtering target comprising the steps of:
mixing a metal powder and an oxide powder including Ti oxide and pressing and sintering a resulting mixed powder A in a vacuum or an inert gas atmosphere to produce a sintered compact A,
pulverizing and sieving the sintered compact A to produce a sintered compact powder A corresponding to non-Cr-based regions in which metal Cr does not exist and where oxides including at least Ti oxide are dispersed in Co or Co—Pt,
mixing a metal powder and oxide powders other than Ti oxide to produce a mixed powder B corresponding to a Cr-based region where oxides other than Ti oxide are dispersed in one or more types of phases selected from the group consisting of Cr, Co—Cr, Cr—Pt, and Co—Cr—Pt, and
mixing the sintered compact powder A and the mixed powder B, and thereafter pressing and sintering a resulting mixed powder in a vacuum or an inert gas atmosphere to produce a secondary sintered compact to be used as a target material;
wherein the secondary sintered compact contains, as metal components, 0.5 to 45 mol % of Cr and remainder being Co or 0.5 to 30 mol % of Cr, 0.5 to 30 mol % of Pt, and remainder being Co, and contains, as non-metal components, two or more types of oxides including Ti oxide;
wherein a structure of the secondary sintered compact is configured from non-Cr-based regions in which metal Cr does not exist and where oxides including at least Ti oxide are dispersed in Co or Co—Pt, and a Cr-based region where oxides other than Ti oxide are dispersed in one or more types of phases of Cr, Co—Cr, Cr—Pt or Co—Cr—Pt; and
wherein the non-Cr-based regions of the secondary sintered compact are scattered in the Cr-based region of the secondary sintered compact.

7. The method of producing a sputtering target according to claim 6, wherein a grain size of the sintered compact powder A is 20 to 200 µm.

8. The sputtering target according to claim 2, wherein a content of the oxides in the sputtering target is, based on a volume ratio, 20% or more and less than 50%.

9. The sputtering target according to claim 2, wherein the sputtering target contains, as metal components, one or more types of elements selected from B, Cu, Mo, Ru, Ta, and W.

10. The sputtering target according to claim 1, wherein the two or more types of oxides include oxides of one or more types of elements selected from B, Mg, Al, Si, Cr, Zr, Nb, and Ta.

11. The sputtering target according to claim 10, wherein a content of the oxides in the sputtering target is, based on a volume ratio, 20% or more and less than 50%.

12. The sputtering target according to claim 11, wherein the sputtering target contains, as metal components, one or more types of elements selected from B, Cu, Mo, Ru, Ta, and W.

13. The sputtering target according to claim 1, wherein a content of the oxides in the sputtering target is, based on a volume ratio, 20% or more and less than 50%.

14. The sputtering target according to claim 1, wherein the sputtering target contains, as metal components, one or more types of elements selected from B, Cu, Mo, Ru, Ta, and W.

* * * * *